(12) United States Patent
Cheng et al.

(10) Patent No.: US 10,559,662 B2
(45) Date of Patent: Feb. 11, 2020

(54) HYBRID ASPECT RATIO TRAPPING

(71) Applicant: INTERNATIONAL BUSINESS MACHINES CORPORATION, Armonk, NY (US)

(72) Inventors: Kangguo Cheng, Schenectady, NY (US); Ramachandra Divakaruni, Ossining, NY (US); Hong He, Albany, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 15/467,821

(22) Filed: Mar. 23, 2017

(65) Prior Publication Data

US 2017/0194435 A1     Jul. 6, 2017

Related U.S. Application Data

(62) Division of application No. 14/672,311, filed on Mar. 30, 2015, now Pat. No. 9,608,067.

(51) Int. Cl.
*H01L 29/10* (2006.01)
*H01L 29/78* (2006.01)
*H01L 21/28* (2006.01)
*H01L 29/161* (2006.01)
*H01L 29/04* (2006.01)

(52) U.S. Cl.
CPC .... *H01L 29/1054* (2013.01); *H01L 21/28026* (2013.01); *H01L 21/28158* (2013.01); *H01L 29/045* (2013.01); *H01L 29/161* (2013.01); *H01L 29/785* (2013.01); *H01L 29/7851* (2013.01)

(58) Field of Classification Search
CPC ........... H01L 29/1054; H01L 21/28026; H01L 21/28158; H01L 29/045; H01L 29/161; H01L 29/785; H01L 29/7851
See application file for complete search history.

(56) References Cited

U.S. PATENT DOCUMENTS

| | | | |
|---|---|---|---|
| 8,173,551 B2 | 5/2012 | Bai et al. | |
| 9,570,298 B1 * | 2/2017 | Basker | H01L 21/02667 |
| 9,576,857 B1 * | 2/2017 | Xie | H01L 21/76224 |
| 2007/0128840 A1 * | 6/2007 | Chen | H01L 21/02381 |
| | | | 438/493 |
| 2008/0073667 A1 | 3/2008 | Lochtefeld | |

(Continued)

FOREIGN PATENT DOCUMENTS

| EP | 2 629 320 A2 | 8/2013 |
|---|---|---|
| WO | 2008/030574 A1 | 3/2008 |

OTHER PUBLICATIONS

List of IBM Patents or Patent Applications Treated as Related Dated Mar. 23, 2017 2 Pages.

*Primary Examiner* — Peter Bradford
(74) *Attorney, Agent, or Firm* — Scully, Scott, Murphy & Presser, P.C.; Steven J. Meyers

(57) ABSTRACT

A semiconductor structure includes a material stack located on a surface of a semiconductor substrate. The material stack includes, from bottom to top, a silicon germanium alloy portion that is substantially relaxed and defect-free and a semiconductor material pillar that is defect-free. A dielectric material structure surrounds sidewalls of the material stack and is present on exposed portions of the semiconductor substrate.

18 Claims, 4 Drawing Sheets

(56) References Cited

U.S. PATENT DOCUMENTS

| | | | |
|---|---|---|---|
| 2008/0099785 A1 | 5/2008 | Bai et al. | |
| 2011/0092047 A1* | 4/2011 | Gaines | H01L 21/76224 438/424 |
| 2012/0199876 A1 | 8/2012 | Bai et al. | |
| 2013/0161756 A1* | 6/2013 | Glass | H01L 29/66545 257/369 |
| 2015/0024573 A1* | 1/2015 | Jacob | H01L 29/66628 438/424 |
| 2015/0228755 A1* | 8/2015 | Wei | H01L 29/6681 257/192 |
| 2015/0318176 A1* | 11/2015 | Qi | H01L 29/6681 438/283 |
| 2015/0318180 A1* | 11/2015 | Rim | H01L 21/845 257/347 |
| 2017/0069661 A1* | 3/2017 | Zhang | H01L 27/1203 |

* cited by examiner

HYBRID ASPECT RATIO TRAPPING

BACKGROUND

The present application relates to a semiconductor structure and a method of forming the same. More particularly, the present application relates to a semiconductor structure including a material stack of, from bottom to top, a semiconductor seed material that is substantially relaxed and defect-free, and a high-mobility semiconductor channel material that is also defect-free.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

One technique for improving device performance is to provide MOSFETs that are formed upon a channel that is composed of a high-mobility semiconductor material such as, for example, germanium or an III-V compound semiconductor. Aspect ratio trapping (ART) is touted as a viable approach for providing high-mobility semiconductor channel materials. Conventional ART includes first forming a defective semiconductor seed layer in a trench to relax the strain and thereafter the channel material is grown on the defective semiconductor seed layer. In ART, the defects are trapped in the semiconductor seed layer and the channel layer is defect-free.

Conventional ART processes however have some drawbacks associated therewith. For example, the defective semiconductor seed layer has to be isolated from the device layer which is not trivial to achieve without requiring complicated processes. Moreover, and in conventional ART processes, a small number of defects may propagate from the semiconductor seed layer into the overlying channel material, rendering manufacturability of conventional ART questionable.

As such, there is still a need for providing a method of forming high-mobility semiconductor channel materials that avoids the drawbacks associated with conventional ART processes.

SUMMARY

In one aspect of the present application, a semiconductor structure is provided that includes a material stack that is located on a surface of a semiconductor substrate. The material stack includes, from bottom to top, a silicon germanium alloy portion that is substantially relaxed and defect-free and a semiconductor material pillar that is defect-free. A dielectric material structure surrounds sidewalls of the material stack and is present on exposed portions of the semiconductor substrate. The semiconductor material pillar is selected from at least one of germanium, an III-V compound semiconductor, strained Si and a silicon germanium alloy having a germanium concentration that is different from that of the silicon germanium alloy portion.

In another aspect of the present application, a method of forming a semiconductor structure is provided. In accordance with one embodiment of the present application, the method includes providing a material stack on a surface of a semiconductor substrate. The material stack includes, from bottom to top, a silicon germanium alloy portion that is substantially relaxed and defect-free and a hard mask material portion. A dielectric material structure is provided surrounding sidewalls of the material stack and present on exposed portions of the semiconductor substrate. The dielectric material structure has a topmost surface that is coplanar with a topmost surface of the hard mask material portion. Next, the hard mask material portion is removed, and thereafter, a semiconductor material pillar is epitaxially grown on a topmost surface of the silicon germanium alloy portion. The semiconductor material pillar that is epitaxially grown is defect-free. The semiconductor material pillar is selected from at least one of germanium, an III-V compound semiconductor, strained Si and a silicon germanium alloy having a germanium concentration that is different from that of the silicon germanium alloy portion.

DETAILED DESCRIPTION

Figure 1:
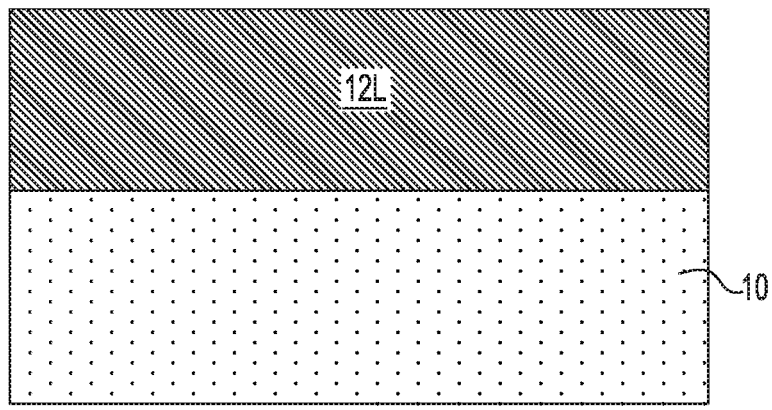
FIG. 1 is a cross sectional view of an exemplary semiconductor structure of, from bottom to top, a semiconductor substrate and a silicon germanium alloy layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated an exemplary semiconductor structure of, from bottom to top, a semiconductor substrate 10 and a silicon germanium alloy layer 12L that can be employed in accordance with an embodiment of the present application.

In some embodiments of the present application, the semiconductor substrate 10 can be a bulk semiconductor substrate. The term "bulk semiconductor substrate" denotes a substrate that is entirely composed of at least one semiconductor material. When a bulk semiconductor substrate is employed as semiconductor substrate 10, the bulk semiconductor substrate can be comprised of any semiconductor material including, but not limited to, Si, Ge, SiGe, SiC, SiGeC, and III/V compound semiconductors such as, for example, InAs, GaAs, and InP. Multilayers of these semiconductor materials can also be used as the semiconductor material of the bulk semiconductor substrate. In one embodiment, the bulk semiconductor substrate that can provide the semiconductor substrate 10 can be comprised of a single crystalline semiconductor material, such as, for example, single crystalline silicon. In other embodiments, the bulk semiconductor substrate that can provide the semiconductor substrate 10 may comprise a polycrystalline or amorphous semiconductor material.

In another embodiment, the semiconductor substrate 10 may comprise a semiconductor-on-insulator (SOI) substrate (not specifically shown). Although not specifically shown, one skilled in the art understands that an SOI substrate includes a handle substrate, an insulator layer located on an upper surface of the handle substrate, and a topmost semiconductor layer located on an upper surface of the insulator layer. The handle substrate provides mechanical support for the insulator layer and the topmost semiconductor layer.

The handle substrate and the topmost semiconductor layer of the SOI substrate may comprise the same, or different, semiconductor material. The semiconductor material of the handle substrate and the topmost semiconductor layer can include one of the semiconductor materials mentioned above for the bulk semiconductor substrate. Multilayers of semiconductor materials can also be used as the semiconductor material of the handle substrate and the topmost semiconductor layer. In one embodiment, the handle substrate and the topmost semiconductor layer are both comprised of silicon. In some embodiments, the handle substrate is a non-semiconductor material including, for example, a dielectric material and/or a conductive material. In yet other embodiments, the handle substrate can be omitted and a substrate including the insulator layer and the topmost semiconductor layer can be used in the present application.

In some embodiments, the handle substrate and the topmost semiconductor layer of the SOI substrate may have the same or different crystal orientation. For example, the crystal orientation of the handle substrate and/or the semiconductor layer may be {100}, {110}, or {111}. Other crystallographic orientations besides those specifically mentioned can also be used in the present application. The handle substrate and/or the top semiconductor layer of the SOI substrate may be a single crystalline semiconductor material, a polycrystalline material, or an amorphous material. Typically, at least the topmost semiconductor layer is a single crystalline semiconductor material. In some embodiments, the topmost semiconductor layer that is located atop the insulator layer can be processed to include semiconductor regions having different crystal orientations.

The insulator layer of the SOI substrate may be a crystalline or non-crystalline oxide or nitride. In one embodiment, the insulator layer is an oxide such as, for example, silicon dioxide. The insulator layer may be continuous or it may be discontinuous. When a discontinuous insulator region is present, the insulator region can exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the topmost semiconductor layer to a layer having a thickness that is more desirable.

In one example, the thickness of the topmost semiconductor layer of the SOI substrate can be from 10 nm to 100 nm. In another example, the thickness of the topmost semiconductor layer of the SOI substrate can be from 50 nm to 70 nm. In some embodiments, and when an ETSOI (extremely thin semiconductor-on-insulator) substrate is employed, the topmost semiconductor layer of the SOI has a thickness of less than 10 nm. If the thickness of the topmost semiconductor layer is not within one of the above mentioned ranges, a thinning step such as, for example, planarization or etching can be used to reduce the thickness of the topmost semiconductor layer to a value within one of the ranges mentioned above. The insulator layer of the SOI substrate typically has a thickness from 1 nm to 200 nm, with a thickness from 100 nm to 150 nm being more typical. The thickness of the handle substrate of the SOI substrate is inconsequential to the present application.

The silicon germanium alloy layer 12L is a blanket layer of a silicon germanium (i.e., SiGe) alloy that is formed entirely across a semiconductor material surface of the semiconductor substrate 10. By "blanket layer" it is meant a contiguous material layer that is formed on a surface of an underlying material. The silicon germanium alloy layer 12L that is employed in the present application has a same lattice constant as the underlying semiconductor substrate 10 and therefore it is fully strained after epitaxy. In one embodiment, the silicon germanium alloy layer 12L is metastably strained. By "metastably strained" it is meant that the grown silicon germanium alloy layer 12L is fully strained and defect-free after epitaxy growth. When enough energy is provided to the silicon germanium alloy layer 12L (e.g., thermal anneal at high temperature), the silicon germanium alloy layer 12L will relax by generating defects (e.g., dislocations) at the SiGe/Si substrate interface and in the silicon germanium alloy layer 12L. In another embodiment, the silicon germanium alloy layer 12L can be strained and in a thermal equilibrium condition, meaning the silicon germanium alloy layer 12L remains fully strained and no defects will be generated even when the silicon germanium alloy layer 12L is annealed. For the present application, both metastably and thermal equilibrium strained SiGe work. The strain relaxation in the subsequent step after fin patterning is caused by elastic relaxation.

The silicon germanium alloy layer 12L of the present application is defect-free. The term "defect-free" is used throughout the present application to denote a material in which defects such as, for example, stacking faults and/or threading dislocations, are present at a defect density of less than 1E3 defects/cm$^3$ and including zero defects throughout an entirety of the material.

In one embodiment, the silicon germanium alloy layer 12L that is provided may have a germanium content from 10 atomic percent (%) germanium to 90 atomic % germanium. In another embodiment, the silicon germanium alloy layer that is provided may have a germanium content from 20 atomic % germanium to 80 atomic % germanium. In one embodiment of the present application, the silicon germanium alloy layer 12L can have a thickness from 10 nm to 200 nm. Other thickness and/or germanium concentrations that are lesser than, or greater than, the aforementioned ranges can also be employed so long as the silicon germanium alloy layer 12L that is formed is strained and defect-free after epitaxy growth.

The silicon germanium alloy layer 12L can be formed by an epitaxial growth (i.e., epitaxial deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces. In the present application, the silicon germanium alloy layer 12L has an epitaxial relationship with the topmost semiconductor material of the semiconductor substrate 10.

Examples of various epitaxial growth processes that are suitable for use in forming epitaxial semiconductor material include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE) or metal-organic CVD (MOCVD). The temperature for epitaxial deposition process typically ranges from 250° C. to 900° C. Although higher temperature typically results in faster deposition, the faster deposition may result in crystal defects and film cracking.

A number of different source gases may be used for the deposition of the silicon germanium alloy layer 12L. In some embodiments, the source gas for the deposition of the silicon germanium alloy layer 12L includes a mixture of a silicon containing gas source and a germanium containing gas source. In other embodiments, the source gas for the deposition of the silicon germanium alloy layer 12L includes a silicon and germanium containing source gas. Carrier gases like hydrogen, nitrogen, helium and argon can be used.

Figure 2:
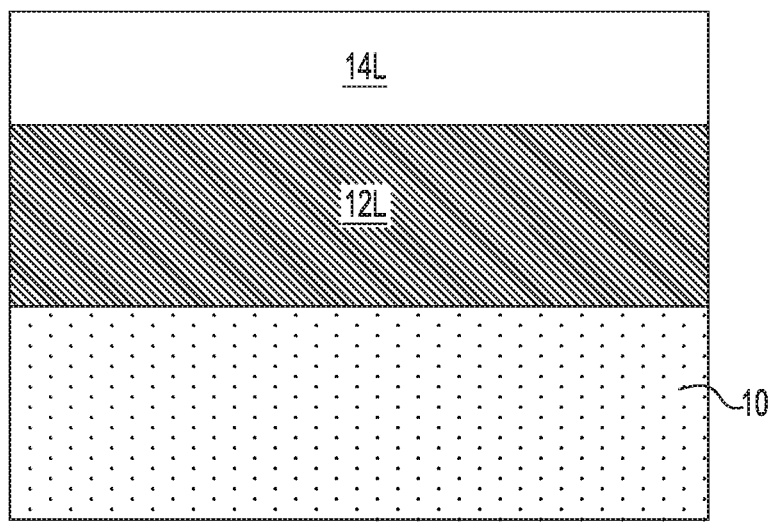
FIG. 2 is a cross sectional view of the exemplary semiconductor structure of FIG. 1 after forming a hard mask layer on a topmost surface of the silicon germanium alloy layer.

Referring now to FIG. 2, there is illustrated the exemplary semiconductor structure of FIG. 1 after forming a hard mask layer 14L on a topmost surface of the silicon germanium alloy layer 12L. The hard mask layer 14L comprises a blanket layer of hard mask material. The blanket layer of hard mask material that can provide the hard mask layer 14L can include a semiconductor oxide, a semiconductor nitride, a semiconductor oxynitride or a combination thereof. In one example, the blanket layer of hard mask material that provides the hard mask layer 14L comprises silicon dioxide. In another example, the blanket layer of hard mask material that provides the hard mask layer 14L comprises silicon nitride. In yet a further example, the blanket layer of hard mask material that provides the hard mask layer 14L can be a hard mask material stack of, in any order, silicon dioxide and silicon nitride.

In some embodiments of the present application, the blanket layer of hard mask material that provides the hard mask layer 14L can be formed by a deposition process such as, for example, chemical vapor deposition (CVD) or plasma enhanced chemical vapor deposition (PECVD). In other embodiments of the present application, the blanket layer of hard mask material that provides the hard mask layer 14L can be formed by a thermal process such as, for example, thermal oxidation and/or thermal nitridation. In yet a further embodiment, the blanket layer of hard mask material that provides the hard mask layer 14L can be formed by a combination of a deposition process and a thermal process. In one embodiment of the present application, the blanket layer of hard mask material that provides the hard mask layer 14L has a thickness from 1 nm to 20 nm. Other thicknesses that are lesser than, or greater than, the aforementioned thickness range may also be used as the thickness of the blanket layer of hard mask material that provides the hard mask layer 14L.

Figure 3:
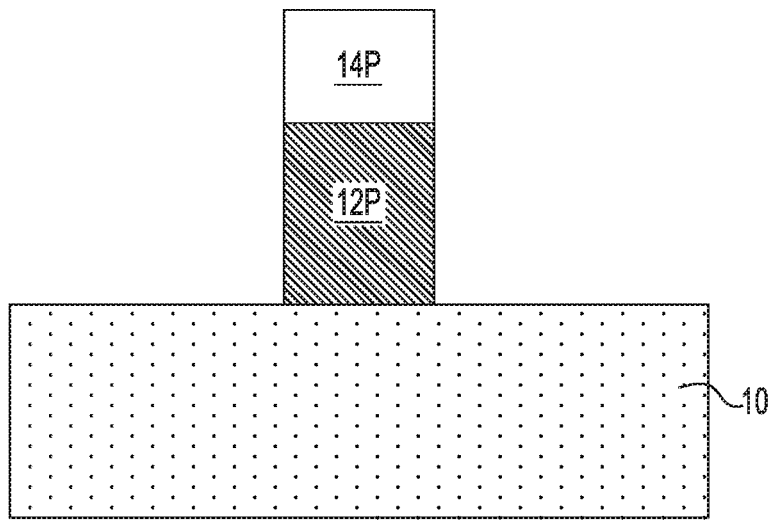
FIG. 3 is a cross sectional view of the exemplary semiconductor structure of FIG. 2 after patterning the hard mask layer and the silicon germanium alloy layer.

Referring now to FIG. 3, there is illustrated the exemplary semiconductor structure of FIG. 2 after patterning the hard mask layer 14L and the silicon germanium alloy layer 12L. The patterning provides a material stack that includes, from top to bottom, a remaining portion of the hard mask layer 14L and a remaining portion of the silicon germanium alloy layer 12L. The remaining portion of the hard mask layer 14L may be referred to herein as a hard mask material portion 14P and the remaining portion of the silicon germanium alloy layer 12L may be referred to herein as a silicon germanium alloy portion 12P. Although a single material stack of a hard mask material portion 14P and a silicon germanium alloy portion 12P is described and illustrated, a plurality of such a material stack (12P, 14P) may be formed on different portions of the underlying semiconductor substrate. In some embodiments, a portion of the semiconductor substrate is also etched (not shown).

The patterning of the silicon germanium alloy layer 12L elastically relaxes the strain within the silicon germanium alloy material such that the resultant silicon germanium alloy portion 12P is substantially relaxed (i.e., it has strain level that is less than 20% of the original strain level after epitaxy). In one embodiment, the silicon germanium alloy portion 12P is close to fully relaxed, meaning the remaining strain level is close to zero. In addition to being substantially relaxed, the silicon germanium alloy portion 12P is entirely defect-free. The silicon germanium alloy portion 12P that is formed by patterning has a width from 1 nm to 40 nm. Other widths are possible as long as the selected width provides a substantially relaxed silicon germanium alloy portion 12P. As is shown, the sidewalls of the silicon germanium alloy portion 12P are vertically aligned with the sidewalls of the overlying hard mask material portion 14P.

In one embodiment, the patterning of the hard mask layer 14L and the silicon germanium alloy layer 12L may comprise lithography and an anisotropic etch. Lithography includes forming a photoresist material (not shown) on a surface of the hard mask layer 14L. The photoresist material may include a positive-tone material, a negative tone material, or hybrid tone material. The photoresist material can be formed as a blanket layer by a deposition process such as, for example, spin-on coating, CVD, PECVD, evaporation or chemical solution deposition. The blanket layer of photoresist material is then exposed to a desired pattern of irradiation and then the exposed photoresist material is developed utilizing a conventional resist developer. After developing the exposed photoresist material, an anisotropic etch is used to transfer the pattern into the blanket layer of hard mask material. Examples of anisotropic etching processes that can used to transfer the pattern may include dry etching (i.e., reactive ion etching, plasma etching, ion beam etching or laser ablation) and/or a chemical wet etch process. In one example, the anisotropic etch process used to transfer the pattern may include a reactive ion etch. Upon completion of the pattern transfer, the remaining portions of the photoresist material are removed utilizing a resist stripping process such as, for example, ashing.

In another embodiment of the present application, the patterning of the hard mask layer 14L and the silicon germanium alloy layer 12L may include a sidewall image transfer (SIT) process. The SIT process includes forming a contiguous mandrel material layer (not shown) on the hard mask layer 14L. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the blanket layer of hard mask material.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Typically, the dielectric spacer material comprises a different dielectric material than the mandrel structures. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material as compared to the material of the dielectric spacers and the blanket layer of hard mask material. Following the mandrel structure removal, the SIT process continues by transferring the pattern provided by the dielectric spacers into the blanket layer of hard mask material. The pattern transfer may be achieved by an anisotropic etching process. Upon completion of the pattern transfer, the SIT process concludes by removing the dielectric spacers from the structure. Each dielectric spacer may be removed by etching or a planarization process.

Figure 4:
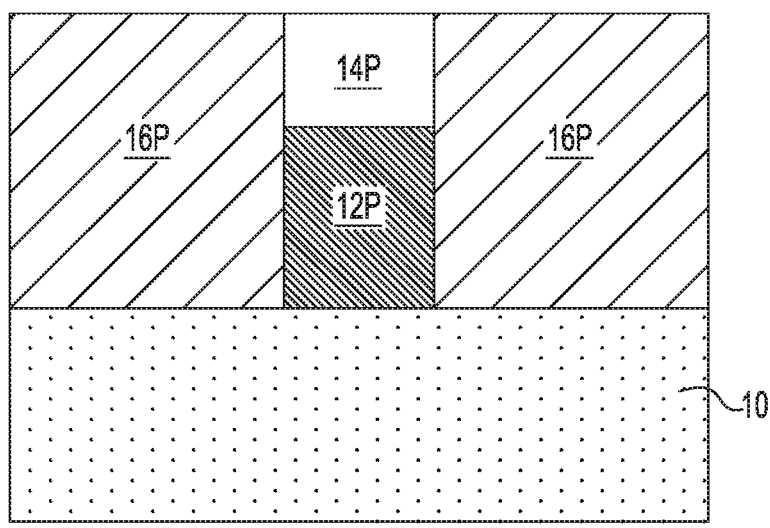
FIG. 4 is a cross sectional view of the exemplary semiconductor structure of FIG. 3 after forming a dielectric material structure on exposed portions of the semiconductor substrate.

Referring now to FIG. 4, there is illustrated the exemplary semiconductor structure of FIG. 3 after forming a dielectric material structure 16P on exposed portions of the semiconductor substrate 10. The dielectric material structure 16P has a topmost surface that is coplanar with a topmost surface of a remaining portion of the hard mask layer (i.e., hard mask material portion 14P), and the dielectric material structure 16P surrounds the vertical sidewalls of the material stack of the hard mask material portion 14P and the silicon germanium alloy portion 12P. In the embodiment where a portion of the semiconductor substrate is etched, the dielectric material structure 16P also surrounds the vertical sidewalls of the etched semiconductor substrate.

The dielectric material structure 16P includes a dielectric material that is compositionally different from the hard mask material that provides the hard mask layer 14L. Dielectric material structure 16P may include an oxide, nitride and/or oxynitride. In one embodiment, and when the hard mask layer 14L comprises silicon nitride, the dielectric material structure 16P may comprise silicon dioxide. In another embodiment, and when the hard mask layer 14L comprises silicon dioxide, the dielectric material structure 16P may comprise silicon nitride and/or silicon oxynitride. The dielectric material structure 16P may be formed by utilizing one of the deposition processes mentioned above in forming the hard mask layer 14L. A planarization process such as, for example, chemical mechanical polishing and/or grinding may follow the deposition of the dielectric material that provides the dielectric material structure 16P. The dielectric material structure 16P may serve as an isolation structure between neighboring semiconductor devices.

Figure 5:
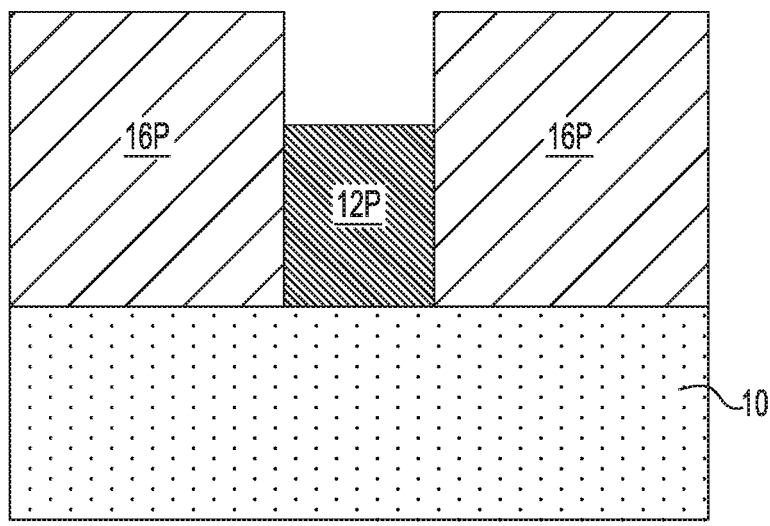
FIG. 5 is a cross sectional view of the exemplary semiconductor structure of FIG. 4 after removing the remaining portion of the hard mask layer to expose a topmost surface of a remaining portion of the silicon germanium alloy layer.

Referring now to FIG. 5, there is illustrated the exemplary semiconductor structure of FIG. 4 after removing the remaining portion of the hard mask layer (i.e., hard mask material portion 14P) to expose a topmost surface of a remaining portion of the silicon germanium alloy layer (i.e., silicon germanium alloy portion 12P). The removal of the hard mask material portion 14P is performed utilizing an etch process that is selective in removing the dielectric material that provides the hard mask material portion 14P relative to the dielectric material that provides the dielectric material structure 16P. In one embodiment, the etch is an anisotropic etching process such as, for example, reactive ion etching. In another embodiment, the etch is an isotropic etch. In some embodiments, the etch is a combination of anisotropic and isotropic etches.

Figure 6:
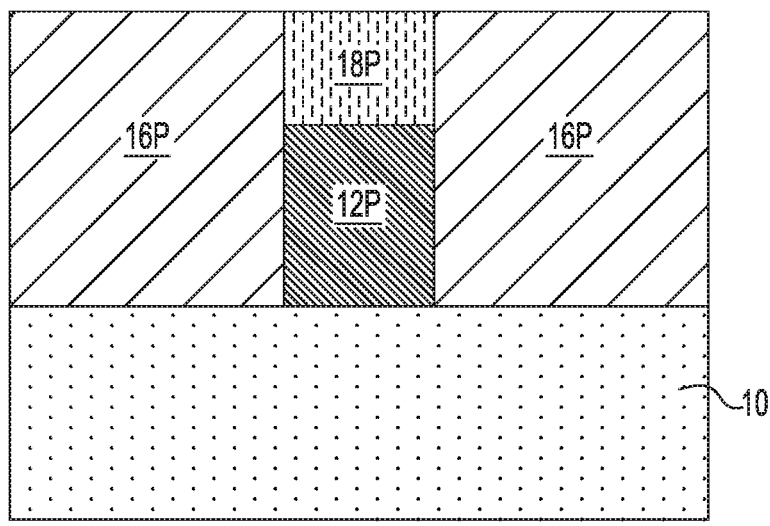
FIG. 6 is a cross sectional view of the exemplary semiconductor structure of FIG. 5 after forming a semiconductor material pillar on the exposed topmost surface of the remaining portion of the silicon germanium alloy layer.

Referring now to FIG. 6, there is illustrated the exemplary semiconductor structure of FIG. 5 after forming a semiconductor material pillar 18P on the exposed topmost surface of the remaining portion of the silicon germanium alloy layer (i.e., silicon germanium alloy portion 12P). In accordance with the present application, the silicon germanium alloy portion 12P is used as a seed layer for forming a high-mobility semiconductor channel material, i.e., the semiconductor material pillar 18P. The semiconductor material pillar 18P is defect-free. The semiconductor material pillar 18P is selected from at least one of germanium, an III-V compound semiconductor, strained Si and a silicon germanium alloy having a germanium concentration that is different from that of the silicon germanium alloy portion.

In one embodiment, the semiconductor material pillar 18P is entirely composed of germanium. In another embodiment, the semiconductor material pillar is entirely composed of an III-V compound semiconductor. The term "III-V compound semiconductor" is used in the present application to denote a semiconductor material that includes at least one element from Group III of the Periodic Table of Elements and at least one Element from Group V of the Periodic Table of Elements. Examples of III-V compound semiconductors include GaAs, InAs, InP, or GaInP. In one embodiment, a single III-V compound semiconductor material can be used as providing the semiconductor material pillar 18P. In another embodiment, a multilayered stack of III-V compound semiconductors can be used in providing the semiconductor material pillar 18P. The semiconductor material pillar 18P may also include a multilayered stack of germanium and an III-V compound semiconductor. In some embodiments, the semiconductor material pillar 18P is entirely composed of silicon. In such an embodiment, the silicon that provides the semiconductor material can be of a same chemical component as the semiconductor substrate 10 but the silicon that provides the semiconductor material pillar 18P is tensily strained. In other embodiments, the semiconductor material pillar 18P may comprise a silicon germanium alloy in which the germanium concentration is different from (i.e., lower than, or higher than) that of the underlying silicon germanium alloy portion 12P. When the semiconductor material pillar 18P has a germanium concentration that is higher than the underlying relaxed silicon germanium alloy portion 12P, the semiconductor material pillar 18P containing the silicon germanium alloy is compressively strained. When the semiconductor material pillar 18P has a germanium concentration that is lower than the relaxed silicon germanium alloy portion 12P, the semiconductor material pillar 18P containing the silicon germanium alloy is tensily strained.

The semiconductor material pillar 18P has a bottommost surface that is in direct contact with the exposed topmost surface of the silicon germanium alloy portion 12P. The semiconductor material pillar 18P has sidewalls that are vertically aligned to sidewalls of the underlying silicon germanium alloy portion 12P. The semiconductor material pillar 18P has a topmost surface that is coplanar with a topmost surface of the dielectric material structure 16P. Also, the sidewalls of the semiconductor pillar 18P are in direct contact with upper sidewall portions of the dielectric material structure 16P. The semiconductor material pillar 18P has a same width as the underlying silicon germanium alloy portion 12P.

The semiconductor material pillar 18P can be formed utilizing an epitaxial growth process such as that described above for forming the silicon germanium alloy layer 12. The source gas used in forming the semiconductor material that provides the semiconductor material pillar 18P includes any conventional source gas or mixtures of source gases that can provide a germanium material, and/or an III-V compound semiconductor. When a multilayered semiconductor material pillar 18P is formed, the vacuum may or may not be maintained during the epitaxial growth of the different semiconductor materials that provide the semiconductor material pillar 18P. A planarization process such as, for example, chemical mechanical polishing and/or grinding may follow the epitaxial growth of the semiconductor material that provides the semiconductor material pillar 18P. Since an epitaxial growth process is used in forming the semiconductor material pillar 18P, the semiconductor material pillar 18P has an epitaxial relationship with the underlying topmost surface of the silicon germanium alloy portion 12P. Unlike a conventional ART process, a material stack of, from bottom to top, a silicon germanium alloy portion 12P and a semiconductor material pillar 18P is provided that is entirely defect-free.

Figure 7:
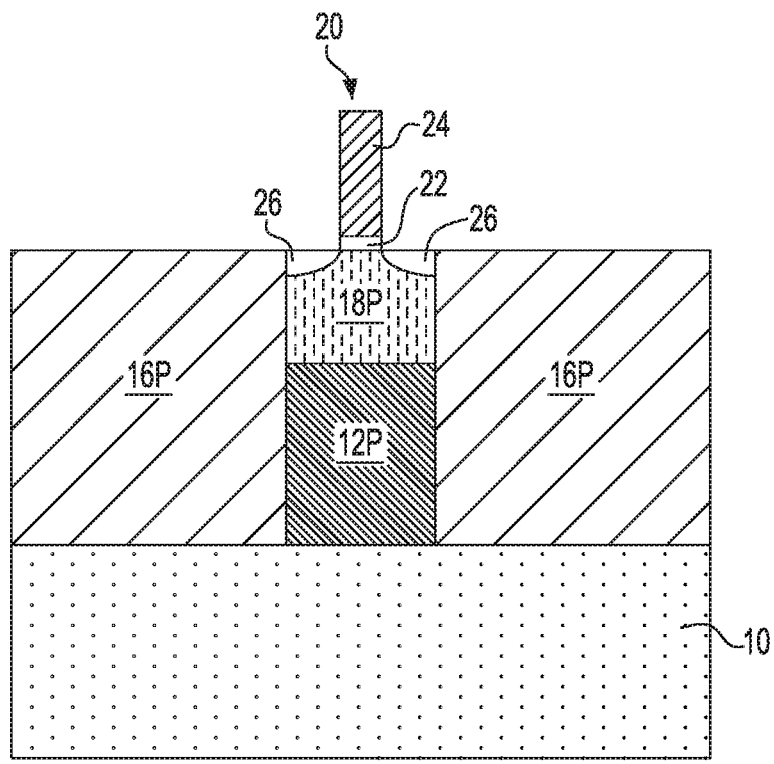
FIG. 7 is a cross sectional view of the exemplary semiconductor structure of FIG. 6 after forming a functional gate structure on a surface of the semiconductor material pillar.

Referring now to FIG. 7, there is illustrated the exemplary semiconductor structure of FIG. 6 after forming a functional gate structure 20 on a planar surface of the semiconductor material pillar 18P. In this embodiment, an upper portion of the semiconductor material pillar 18P that is located directly beneath the functional gate structure 20 can serve as a high-mobility channel region of the resultant structure. Although only one functional gate structure 20 is described and illustrated, a plurality of functional gate structures can be formed as desired. By "functional gate structure" it is meant a permanent gate structure used to control output current (i.e., flow of carriers in the channel) of a semiconducting device through electrical or magnetic fields.

The functional gate structure 20 that is formed includes a gate material stack of, from bottom to top, a gate dielectric portion 22, and a gate conductor portion 24. In some embodiments (not shown), a gate cap portion can be present atop the gate conductor portion 24.

The gate dielectric portion 22 comprises a dielectric material. The gate dielectric material that provides the gate dielectric portion 22 can be an oxide, nitride, and/or oxynitride. In one example, the gate dielectric material that provides the gate dielectric portion 22 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as the gate dielectric portion 22.

The gate dielectric material used in providing the gate dielectric portion 22 can be formed by any deposition process including, for example, chemical vapor deposition (CVD), plasma enhanced chemical vapor deposition (PECVD), physical vapor deposition (PVD), sputtering, or atomic layer deposition. In some embodiments, a thermal process including, for example, thermal oxidation and/or thermal nitridation may be used in forming the gate dielectric material of the gate dielectric portion 22. In some embodiments and when multiple functional gate structures are formed, each gate dielectric portion comprises a same gate dielectric material. In other embodiments and when multiple functional gate structures are provided, some of the gate dielectric portion comprise a first gate dielectric material, while other gate dielectric portions comprises a second dielectric material that differs from the first dielectric material. When a different gate dielectric material is used for the gate dielectric portions, block mask technology can be used. In one embodiment of the present application, the gate dielectric material used in providing the gate dielectric portion 22 can have a thickness in a range from 1 nm to 10 nm. Other thicknesses that are lesser than, or greater than, the aforementioned thickness range can also be employed for the gate dielectric material.

The gate conductor portion 24 comprises a gate conductor material. The gate conductor material used in providing the gate conductor portion 24 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor portion 24 may comprise an nFET gate metal. In other embodiments, the gate conductor portion 24 may comprise a pFET gate metal. In yet other embodiments, and when multiple functional gate structures are formed, some of the gate conductor portions comprise an nFET gate metal, while other gate conductor portions comprises a pFET gate metal.

The gate conductor material used in providing the gate conductor portion 24 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions, block mask technology can be used. In one embodiment, the gate conductor material used in providing the gate conductor portion 24 has a thickness from 1 nm to 100 nm. Other thicknesses that are lesser than, or greater than, the aforementioned thickness range can also be employed for the gate conductor material used in providing the gate conductor portion 24.

When present, the gate cap portion comprises a gate cap material. The gate cap material that provides the optional gate cap portion may include a hard mask material such as, for example, silicon dioxide, silicon nitride, and/or silicon oxynitride. The dielectric material that provides the optional gate cap portion can be formed utilizing a conventional deposition process such as, for example, chemical vapor deposition or plasma enhanced chemical vapor deposition. The dielectric material that provides the optional gate cap portion can have a thickness from 5 nm to 20 nm. Other thicknesses that are lesser than, or greater than, the aforementioned thickness range can also be employed as the thickness of the dielectric material that provides the optional gate cap portion.

The functional gate structure 20 can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching. Source/drain regions 26 can be formed utilizing ion implantation as is conventional. In some embodiments, the source/drains 26 can be formed by forming a source side trench and a drain side trench on opposite sides of the functional gate structure and then epitaxially growing a doped semiconductor material within each trench. Prior to source/drain formation, a gate spacer (not shown) comprising a dielectric may be formed on the sidewalls of each functional gate structure or each sacrificial gate structure. The above represents a gate first process flow.

In other embodiments of the present application (not shown), sacrificial gate structures are first formed (this represents a gate last process flow). By sacrificial gate structure" it is meant a material or material stack that serves as a placeholder for a subsequently formed functional gate structure. In such an embodiment, the gate dielectric portion of the functional gate structures may be U-shaped. By "U-shaped" it is meant a material that includes a bottom horizontal surface and a sidewall surface that extends upward from the bottom horizontal surface. When employed, the sacrificial gate structure may include a sacrificial gate dielectric portion, a sacrificial gate material portion and a sacrificial gate cap portion. In some embodiments, the sacrificial gate dielectric portion and/or sacrificial gate cap portion may be omitted. The sacrificial gate dielectric portion includes one of the dielectric materials mentioned above for the gate dielectric portions of the functional gate structures. The sacrificial gate material portion includes one of the gate conductor materials mentioned above for gate conductor portions of the functional gate structures. The sacrificial gate dielectric portion includes one of the gate cap material mentioned above for gate cap portions of the functional gate structures. The sacrificial gate structures can be formed by deposition of the various material layers and then patterning the resultant sacrificial material sack by utilizing, for example, lithography and etching. The sacrificial gate structures are replaced after forming source/drain regions.

Figure 8:
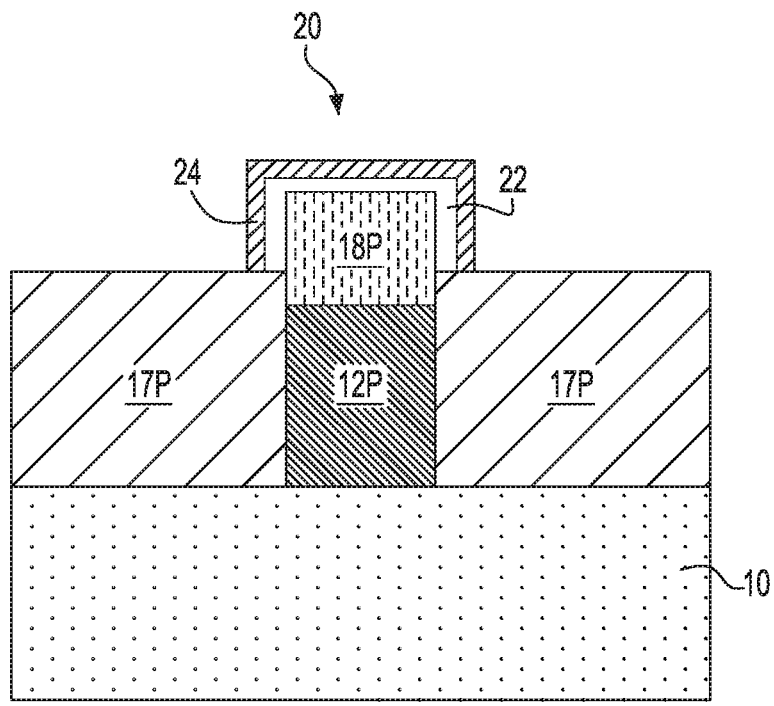
FIG. 8 is a cross sectional view of the exemplary semiconductor of FIG. 6 after recessing the dielectric material structure and forming a functional gate structure on exposed surfaces of the semiconductor material pillar.

Referring now to FIG. 8, there is illustrated the exemplary semiconductor of FIG. 6 after recessing the dielectric material structure 16P and forming a functional gate structure 20 on exposed surfaces of the semiconductor material pillar 18P. In this embodiment, the exposed sidewalls and the topmost surface of semiconductor material pillar serve as a high-mobility channel region. The recessing of the dielectric material structure 16P may be performed utilizing an etch back process that is selective in removing a dielectric material as compared to a semiconductor material. Element 17P is used to denote the recessed dielectric material structure. The recessed dielectric material structure 17P has a topmost surface that is now located beneath a topmost surface of the semiconductor material pillar 18P. The topmost surface of the recessed dielectric material structure 17P may be located anywhere between the topmost surface of the semiconductor material pillar 18P and a bottommost surface of the semiconductor material pillar 18P. In this embodiment, the exposed semiconductor material pillar 18P can serve as a semiconductor fin in providing a FinFET device.

The functional gate structure 20 of this embodiment includes a gate dielectric portion 22 and a gate conductor portion 24 as defined for the functional gate structure shown in FIG. 7. The functional gate structure 20 may be formed as described above utilizing either a gate first or gate last process.

Source/drain regions (not shown) are formed in exposed portions of the semiconductor material pillar 18P that are not covered by the functional gate structure 20 or the sacrificial gate structures. Prior to source/drain formation, a gate spacer comprising a dielectric may be formed on the sidewalls of each functional gate structure or each sacrificial gate structure. The source/drain regions can be formed utilizing conventional techniques such as, for example, epitaxial growth, which are well known to those skilled in the art. As is known, the source region would be located on one side of the functional gate structure and the drain region would be located on another side of the functional gate structures. In some embodiments, the source/drain regions can be unmerged. In yet other embodiments, the source/drain regions can be merged. The source/drain regions comprise a semiconductor material and an n-type or p-type dopant. In some embodiments, the source/drain regions may comprise a same semiconductor material as that of the semiconductor material pillar 18P. In some embodiments, the source/drain regions may comprise a different semiconductor material as that of the semiconductor material pillar 18P.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a material stack consisting of a silicon germanium alloy portion that is relaxed and defect-free and a semiconductor material pillar that is defect-free, wherein the silicon germanium alloy portion is in direct physical contact with a topmost surface of a semiconductor substrate and the semiconductor material pillar is in direct physically contact with a topmost surface of the silicon germanium alloy portion, and wherein an entirety of the semiconductor substrate extends beyond outermost sidewalls of the material stack; and
a dielectric material structure located laterally adjacent to the material stack and having a bottommost surface in direct contact with physically exposed portions of the topmost surface of the semiconductor substrate, wherein the bottommost surface of the dielectric material stack is coplanar with a bottommost surface of the silicon germanium alloy portion of the material stack that forms an interface with the topmost surface of the semiconductor substrate.

2. The semiconductor structure of claim 1, wherein the dielectric material structure has a topmost surface that is coplanar with a topmost surface of the semiconductor material pillar, and wherein a sidewall of the dielectric material structure is in direct physical contact with an entirety of a sidewall of the semiconductor pillar and an entirety of a sidewall of the silicon germanium alloy portion.

3. The semiconductor structure of claim 2, further comprising a functional gate structure located on the topmost surface of the semiconductor material pillar.

4. The semiconductor structure of claim 1, wherein the dielectric material structure has a topmost surface that is located beneath a topmost surface of the semiconductor material pillar, and wherein a sidewall of the dielectric material structure is in direct physical contact with a bottom portion a sidewall of the semiconductor pillar and an entirety of a sidewall of the silicon germanium alloy portion.

5. The semiconductor structure of claim 4, further comprising a functional gate structure located on exposed sidewalls and the topmost surface of the semiconductor material pillar.

6. The semiconductor structure of claim 1, wherein the silicon germanium alloy portion and the semiconductor material pillar have a same width.

7. The semiconductor structure of claim 6, wherein the width is from 1 nm to 40 nm.

8. The semiconductor structure of claim 1, wherein the silicon germanium alloy portion has a germanium content from 20 atomic % germanium to 80% germanium.

9. The semiconductor structure of claim 1, wherein the silicon germanium alloy portion has outermost sidewalls that are vertically aligned to outermost sidewalls of the semiconductor material pillar.

10. The semiconductor structure of claim 1, wherein the silicon germanium alloy portion is fully relaxed.

11. The semiconductor structure of claim 1, wherein the semiconductor substrate is a bulk semiconductor substrate.

12. The semiconductor structure of claim 1, wherein the semiconductor substrate is a semiconductor-on-insulator substrate.

13. The semiconductor structure of claim 1, wherein the semiconductor material pillar is selected from at least one of germanium, an III-V compound semiconductor, strained Si and a silicon germanium alloy having a germanium concentration that is different from that of the silicon germanium alloy portion.

14. The semiconductor structure of claim 13, wherein the semiconductor substrate is composed of silicon and the semiconductor material pillar is composed of tensily strained silicon.

15. The semiconductor structure of claim 1, wherein the semiconductor material pillar is composed of a multilayered stack of III-V compound semiconductors.

16. The semiconductor structure of claim 1, wherein the semiconductor pillar is composed of a multilayered stack of germanium and a III-V compound semiconductor.

17. The semiconductor structure of claim 1, wherein the semiconductor material pillar is composed of a III-V compound semiconductor material having a higher germanium content than the silicon germanium alloy portion, and the semiconductor material pillar is compressively strained.

18. The semiconductor structure of claim 1, wherein the semiconductor material pillar is composed of a III-V compound semiconductor material having a lower germanium content than the silicon germanium alloy portion, and the semiconductor material pillar is tensily strained.

\* \* \* \* \*